United States Patent
Taniguchi

(10) Patent No.: US 10,832,976 B2
(45) Date of Patent: Nov. 10, 2020

(54) CHARGED PARTICLE BEAM DEVICE AND OPTICAL EXAMINATION DEVICE

(71) Applicant: Hitachi High-Tech Corporation, Tokyo (JP)

(72) Inventor: Koichi Taniguchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/473,427

(22) PCT Filed: Jan. 12, 2017

(86) PCT No.: PCT/JP2017/000698
§ 371 (c)(1),
(2) Date: Jun. 25, 2019

(87) PCT Pub. No.: WO2018/131101
PCT Pub. Date: Jul. 19, 2018

(65) Prior Publication Data
US 2020/0161194 A1 May 21, 2020

(51) Int. Cl.
*H01L 21/66* (2006.01)
*H01J 37/20* (2006.01)
(Continued)

(52) U.S. Cl.
CPC .............. *H01L 22/12* (2013.01); *H01J 37/20* (2013.01); *H01J 37/28* (2013.01); *H01J 37/3026* (2013.01); *H01J 2237/2817* (2013.01)

(58) Field of Classification Search
CPC ..... H01L 22/12; H01J 37/20; H01L 37/3026; G01B 15/00
See application file for complete search history.

(56) References Cited

U.S. PATENT DOCUMENTS 5,963,328 A 10/1999 Yoshida et al.
6,542,248 B1 * 4/2003 Schwarz .............. G01B 11/303
356/446
(Continued)

FOREIGN PATENT DOCUMENTS

JP 11-108641 A 4/1999
JP 11-183154 A 7/1999
(Continued)

OTHER PUBLICATIONS

International Search Report (PCT/ISA/210) issued in PCT Application No. PCT/JP2017/000698 dated Apr. 25, 2017 with English translation (seven (7) pages).
(Continued)

*Primary Examiner* — William Coleman
(74) *Attorney, Agent, or Firm* — Crowell & Moring LLP

(57) ABSTRACT

In a semiconductor manufacturing process, it is necessary to cut a die close to the edge of a wafer in order to obtain as many dies as possible from one wafer. Accordingly, with respect to a charged particle beam device and an optical inspection device used in a semiconductor manufacturing process, there is a demand for detecting the height of the wafer close to the edge of the wafer with high accuracy, in order to measure or examine close to the edge of the wafer with high accuracy. Further, there is a demand for high speed height-detection in order to realize high throughput for the semiconductor manufacturing process. In the present invention, the foregoing can be achieved by the following configuration: sandwiching a target region on a wafer, a first pattern and a second pattern are projected onto one side and the other side respectively of the target region from an oblique direction with respect to the wafer top-surface, enabling an image of the first pattern and/or second pattern to be used.

14 Claims, 11 Drawing Sheets

(51) Int. Cl.
    *H01J 37/28*    (2006.01)
    *H01J 37/302*   (2006.01)

(56) References Cited

U.S. PATENT DOCUMENTS

| | | | |
|---|---|---|---|
| 6,597,006 B1 * | 7/2003 | McCord | G01B 11/0625 |
| | | | 250/559.19 |
| 7,599,076 B2 | 10/2009 | Saito et al. | |
| 7,719,687 B2 * | 5/2010 | Matsumoto | G01N 21/57 |
| | | | 356/448 |
| 9,194,810 B2 * | 11/2015 | Schleith | G01N 21/8806 |
| 9,696,674 B2 * | 7/2017 | Ishii | G03G 15/5062 |
| 10,359,276 B2 * | 7/2019 | Lee | G01B 11/245 |
| 2010/0085855 A1 | 4/2010 | Yoshida et al. | |

FOREIGN PATENT DOCUMENTS

| | | |
|---|---|---|
| JP | 2003-17382 A | 1/2003 |
| JP | 2004-257940 A | 9/2004 |
| JP | 4426519 B2 | 3/2010 |
| JP | 2010-91295 A | 4/2010 |
| JP | 2011-89939 A | 5/2011 |
| JP | 2016-33461 A | 3/2016 |

OTHER PUBLICATIONS

Japanese-language Written Opinion (PCT/ISA/237) issued in PCT Application No. PCT/JP2017/000698 dated Apr. 25, 2017 (seven (7) pages).

\* cited by examiner

CHARGED PARTICLE BEAM DEVICE AND OPTICAL EXAMINATION DEVICE

TECHNICAL FIELD

The present invention relates to a charged particle beam device and an optical inspection device, and especially relates to a detection of a height of a wafer.

BACKGROUND ART

In a device for processing a planar substrate, such as any processing device including a charged particle beam device and an optical inspection device, used in a semiconductor manufacturing process, a method for detecting a height of the substrate by irradiating the planar substrate with a light from an oblique direction to detect a position of its reflected light has been used.

Patent Literature 1 discloses a technique to detect a height of an object by projecting a two-dimensional slit light on the object from obliquely above, detecting a reflected light of this projected two-dimensional slit light by the object, converting a two-dimensional slit image of this detected two-dimensional slit light into an electrical signal with a two-dimensional area sensor, and removing a slit part with a large detection error from this converted electrical signal of the two-dimensional slit image.

Patent Literature 2 discloses a technique where, when only a part of a multi-slit image is projected on an object to be measured in a height measurement near an edge of the object to be measured, pattern matching is performed to identify an undetectable slit and the number of undetectable slits among the multi-slit images is calculated to complement an electrical signal for an ideal slit image.

CITATION LIST

Patent Literature

Patent Literature 1: Japanese Patent No. 4426519
Patent Literature 2: Japanese Unexamined Patent Application Publication No. 2016-33461

SUMMARY OF INVENTION

Technical Problem

In the semiconductor manufacturing process, for obtaining more dies from one wafer, it is requested to obtain the dies near an edge of the wafer. In association with this, for measurement and inspection to the nearby wafer edge with high accuracy, it is requested for the charged particle beam device and the optical inspection device used in the semiconductor manufacturing process to detect the height of the wafer to the nearby wafer edge with high accuracy. Additionally, for improving a throughput in the semiconductor manufacturing process, a height detection at a high speed is requested.

To these requests, Patent Literature 1 discloses the technique to remove the slit part with the large detection error from the electrical signal of the two-dimensional slit image. However, since the image cannot be fully obtained in the regions near the edge, it is impossible to obtain the image that is basis of performing the removal process.

The technique disclosed in Patent Literature 2 is disadvantageous for improving the throughput because of a time necessary for identifying and complementing the undetectable slit.

It is an object of the present invention to provide a technique to detect a wafer height to the nearby wafer edge with high accuracy at high speed.

Solution to Problem

In the present invention, a first pattern is projected on one side and a second pattern is projected on another side across a target area on a wafer from an oblique direction with respect to a surface of the wafer. This ensures the use of at least any image of the first pattern and the second pattern, and solves the above-described problem.

Advantageous Effects of Invention

The present invention can provide a technique to detect a wafer height to a nearby wafer edge with high accuracy at high speed. Eventually, dies can be obtained near the wafer edge.

DESCRIPTION OF EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. The following describes embodiments of the present invention with reference to the drawings.

First Embodiment

Figure 1:
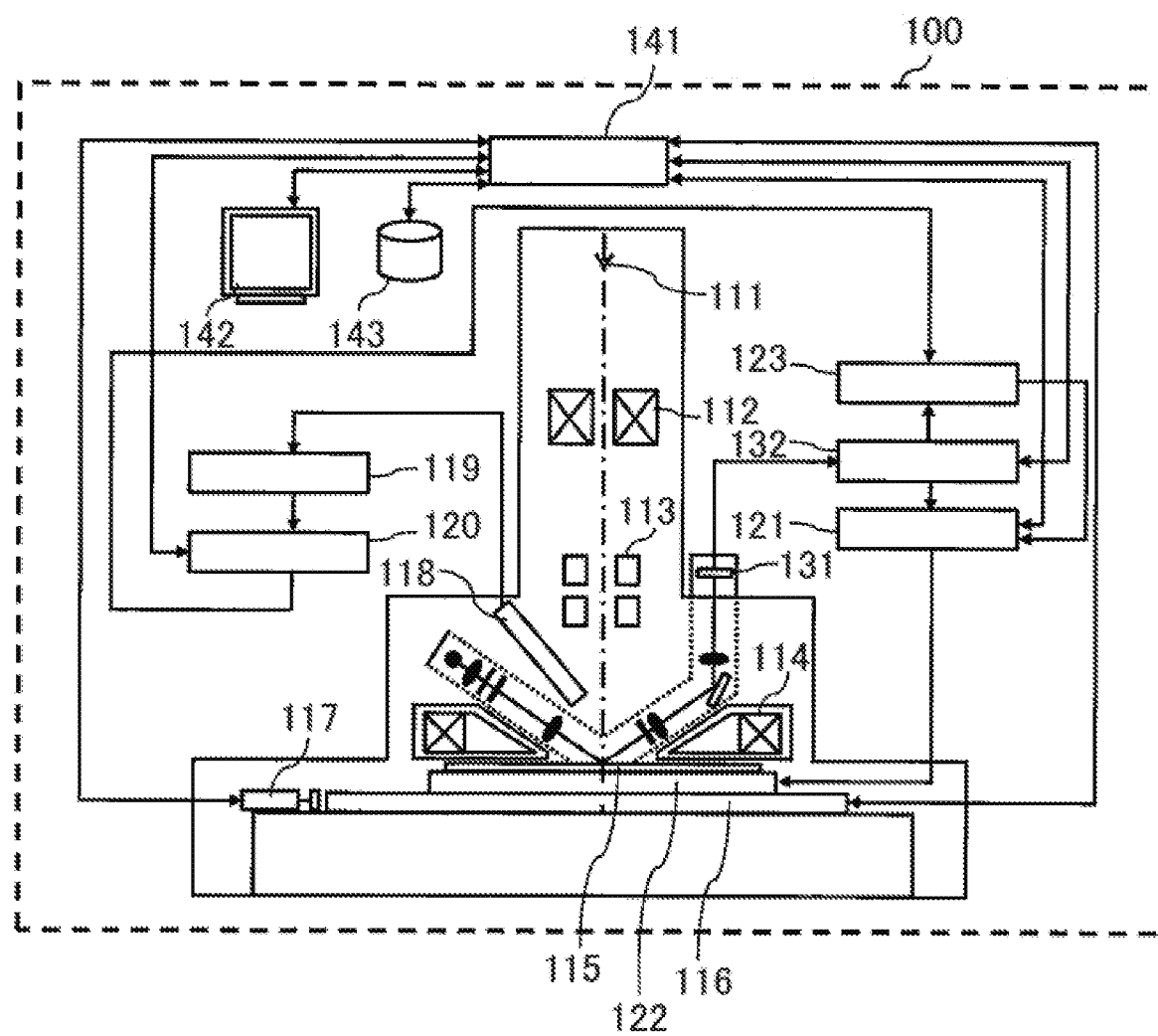
FIG. 1 is a schematic diagram illustrating a device configuration of a CD-SEM device in a first embodiment of the present invention.

FIG. 1 is a schematic diagram illustrating a device configuration of a Critical Dimension Scanning Electron Microscope (CD-SEM) device 100 as a charged particle beam device in the first embodiment of the present invention. The CD-SEM device 100 obtains an electron beam image of a measurement object (object to be measured, object) 115 with a scanning electron microscope, and performs image processing to measure a line width and a hole diameter in a fine pattern of the measurement object 115 for setting conditions and monitoring of a semiconductor manufacturing process. The measurement object 115 is, for example, a semiconductor wafer on which a fine pattern is formed.

The CD-SEM device 100 includes a scanning electron microscope system, a focal point control system, an optical height detection system, and an overall control system. The scanning electron microscope system obtains the electron beam image of the measurement object 115 and performs the image processing. The focal point control system focuses the scanning electron microscope. The optical height detection system detects a height of the measurement object 115.

The scanning electron microscope system includes: an electron beam source 111 that emits an electron beam; a condenser lens 112 that focuses the electron beam emitted from the electron beam source 111; a deflector 113 that two-dimensionally scans the focused electron beam; an objective lens 114 that focuses the electron beam to the measurement object 115; a Z-stage 122 on which the measurement object 115 is placed; an XY-stage 116 that moves the Z-stage 122 movable in a height direction in horizontal two-dimensional directions; a laser measuring device 117 that measures a position of the measurement object 115 moved by the XY-stage 116; a secondary electron detector 118 that emit the electron beam to detect a secondary electron emitted from the measurement object 115; an A/D converter 119 that performs an A/D conversion of a detected secondary electron signal; and image processing means 120 that performs image processing of an electron beam image (SEM image) of the secondary electron signal on which the A/D conversion has been performed and measures a width of a pattern and length of a hole diameter in a specified image.

The optical height detection system includes a projection optical system, a detection optical system, a two-dimensional area sensor, and height detection means. The optical height detection system projects first and second patterns described later on a surface of the measurement object 115 from an oblique direction, and detects a light reflected by the measurement object 115. The optical height detection system further includes an electrical signal detector 131 and a height calculation processor 132. The electrical signal detector 131 detects the electrical signal of at least any image of the first and the second patterns from the two-dimensional area sensor. The height calculation processor 132 chooses at least one image of the first and the second patterns and calculates the height of the measurement object 115.

The focal point control system includes a focal point controller (focal point control means) 121 and an automatic focal point controller (automatic focal point control means) 123. The focal point controller 121 adjusts the height of the measurement object 115 on the Z-stage 122 based on information on the height of the measurement object 115 output from the height calculation processor 132, thus focusing the objective lens 114. The automatic focal point controller 123 detects the electron beam image at the height adjusted by the focal point controller 121 and detects a focusing point position from this electron beam image.

The overall control system controls the whole of the scanning electron microscope system, the focal point control system, and the optical height detection system, and includes an overall control unit 141 that outputs a result of the process by the image processing means 120 to a monitor 142 or a storage 143 as storage means with a coordinate position of the measurement object 115.

Next, the optical height detection optical system will be described with reference to FIG. 2(a), FIG. 2(b), FIG. 3, and FIG. 4.

Figure 2A:
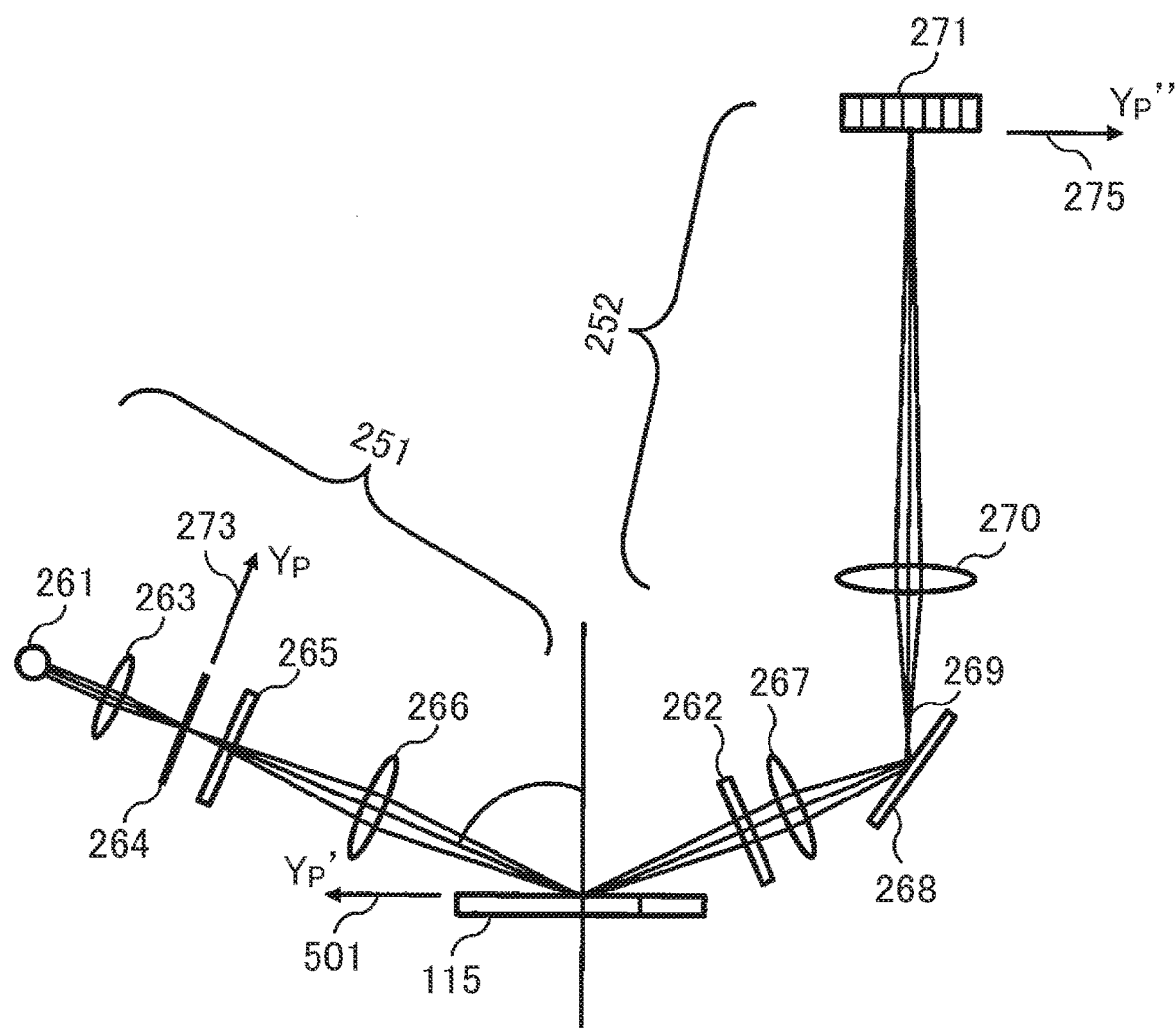
FIG. 2A is a schematic diagram illustrating a configuration of an optical height detection optical system of an embodiment of the present invention.
Figure 2B:
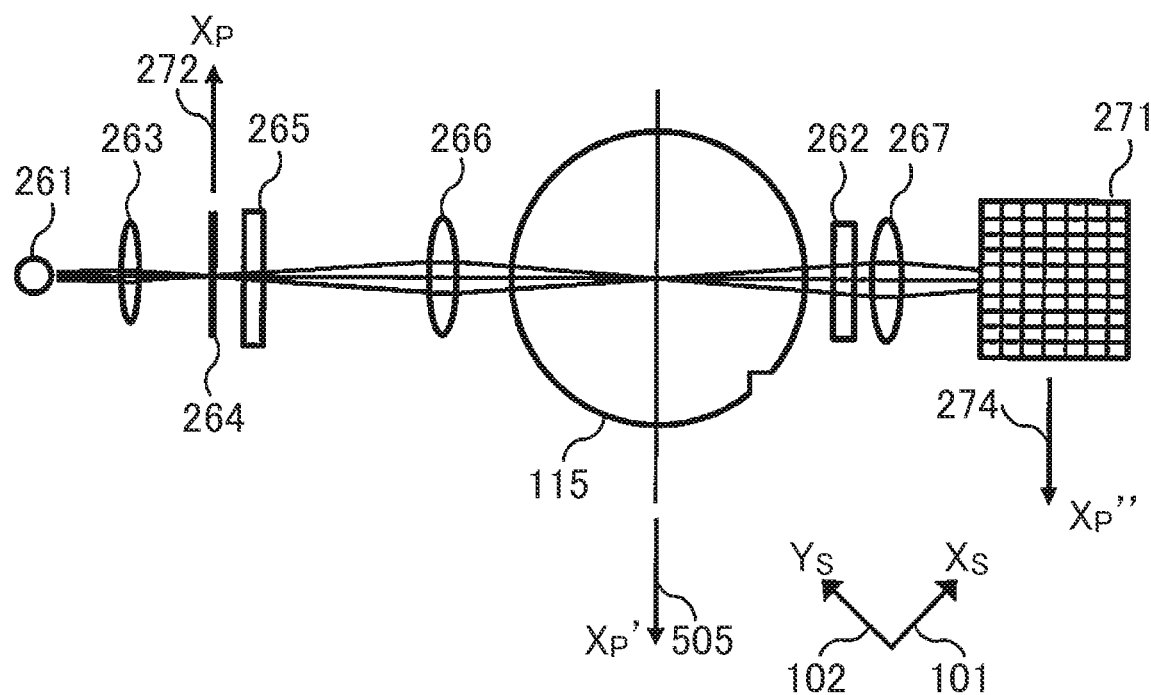
FIG. 2B is a schematic diagram illustrating the configuration of the optical height detection optical system of the embodiment of the present invention.

As illustrated in FIG. 2(a), the optical height detection optical system includes a projection optical system 251 and a detection optical system 252. FIG. 2(b) is a drawing illustrating the optical system, illustrated in a front view in FIG. 2(a), in a plan view.

The projection optical system 251 includes: a white light source 261 such as a halogen lamp; a condenser lens 263 that condenses a white light from the white light source 261; a two-dimensional slit 264 that projects the first and second patterns described later on the measurement object 115 with the light condensed by the condenser lens 263; a polarization filter 265 disposed to transmit an S-polarized light among the lights passing through the two-dimensional slit 264; and a projection lens 266 that condenses the light passing through the polarization filter 265 to form images of the first and second patterns described later near the top of the measurement object 115. When the surface of the measurement object 115 is covered with a transparent film such as an insulation film, the S-polarized light is more easily reflected by the surface of the transparent film than a P-polarized light. Then, the polarization filter 265 transmits the S-polarized light, thus reducing an influence of multiple reflections by the transparent film. As the light source, a laser light source of a single wavelength, a light-emitting diode, and the like can be used instead of the white light source 261. However, a monochromatic light possibly causes a large detection error due to, for example, an interference of multiple reflection lights in the transparent film and an influence to a reflectance by a change in thickness of the transparent film. An $X_s$ direction 101 and a $Y_s$ direction 102, an $X_p$ axis 272 and a $Y_p$ axis 273 of the two-dimensional slit 264, an $X_p'$ axis 505 and a $Y_p'$ axis 501, and an $X_p''$ axis 274 and a $Y_p''$ axis 275 of the two-dimensional area sensor 271 will be described later.

The detection optical system 252 includes a band-pass filter 262, a detection lens 267, a mirror 268, a magnifying lens 270, and a two-dimensional area sensor 271. The band-pass filter 262 transmits a light in a specific wavelength region among the lights regularly reflected by the measurement object 115 in the lights emitted from the projection optical system 251. The detection lens 267 condenses the light passed through the band-pass filter 262 to form an image 269. The mirror 268 changes a traveling direction of the regular reflection light passed through the detection lens 267. The magnifying lens 270 enlarges the image 269 formed by the detection lens 267 and forms the image on the two-dimensional area sensor 271. The detection optical system 252 can obtain the images of the first and the second patterns described later. For the two-dimensional area sensor 271, a two-dimensional CCD image sensor and a two-dimensional CMOS image sensor are usable. The band-pass filter 262 restricts the wavelength band of the light from the white light source 261 to reduce chromatic aberration of the detection lens 267 and the magnifying lens 270, thus reducing a wavelength dependence of the image formed on the two-dimensional area sensor 271.

Here, the projection optical system 251 and the detection optical system 252 are disposed to be inclined with respect to the $X_s$ direction 101 as a moving direction of the XY-stage 116 as illustrated in FIG. 2(b) to reduce the detection error in the optical height detection. A moving direction of the XY-stage 116 perpendicular to the $X_s$ direction 101 is defined as the $Y_s$ direction 102. In this embodiment, as illustrated in FIG. 2(b), the projection optical system 251 and the detection optical system 252 are disposed to be inclined with respect to the $X_s$ direction 101 by 45°.

Figure 3:
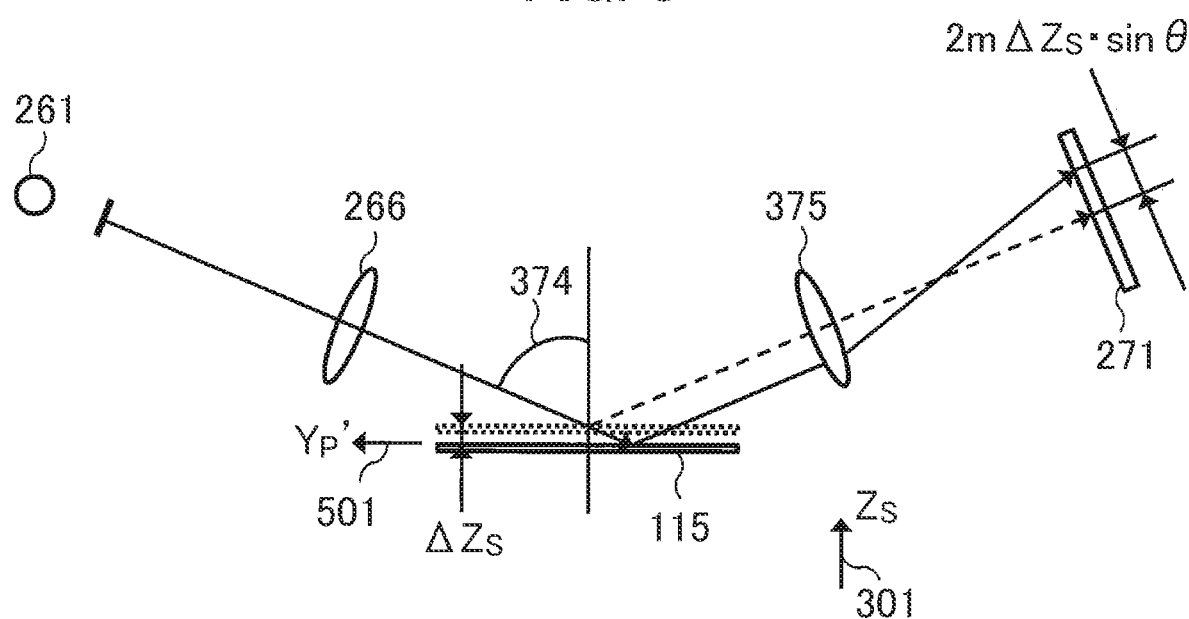
FIG. 3 is a schematic diagram describing a relationship between a height of an object and a shift amount of a slit image in the optical height detection optical system of the embodiment of the present invention.

FIG. 3 is a schematic diagram describing a relationship between a height of an object and a shift amount of a slit image in the optical height detection optical system of this embodiment. As illustrated in FIG. 3, a direction perpendicular to the $X_s$ direction 101 and the $Y_s$ direction 102 is defined as a $Z_s$ direction 301. The $Z_s$ direction 301 corresponds to the moving direction of the Z-stage 122. As illustrated in FIG. 3, in a case where an incident angle 374 of a two-dimensional slit light is θ, a magnification of a detection magnifying lens 375, where the detection lens 267 and the magnifying lens 270 in the detection optical system are integrated, is m, a change of the height of the measurement object 115 by $\Delta Z_s$ shifts the entire two-dimensional slit image on the two-dimensional area sensor 271 by $2m\Delta Z_s \cdot \sin \theta$. By using this, the height calculation processor 132 calculates the shift amount of the two-dimensional slit image based on the electrical signal of the two-dimensional slit image obtained by the two-dimensional area sensor 271, and calculates $\Delta Z_s$ as the change amount of the height of the measurement object 115 from the calculated shift amount. For example, θ can be set to 70°.

Figure 4:
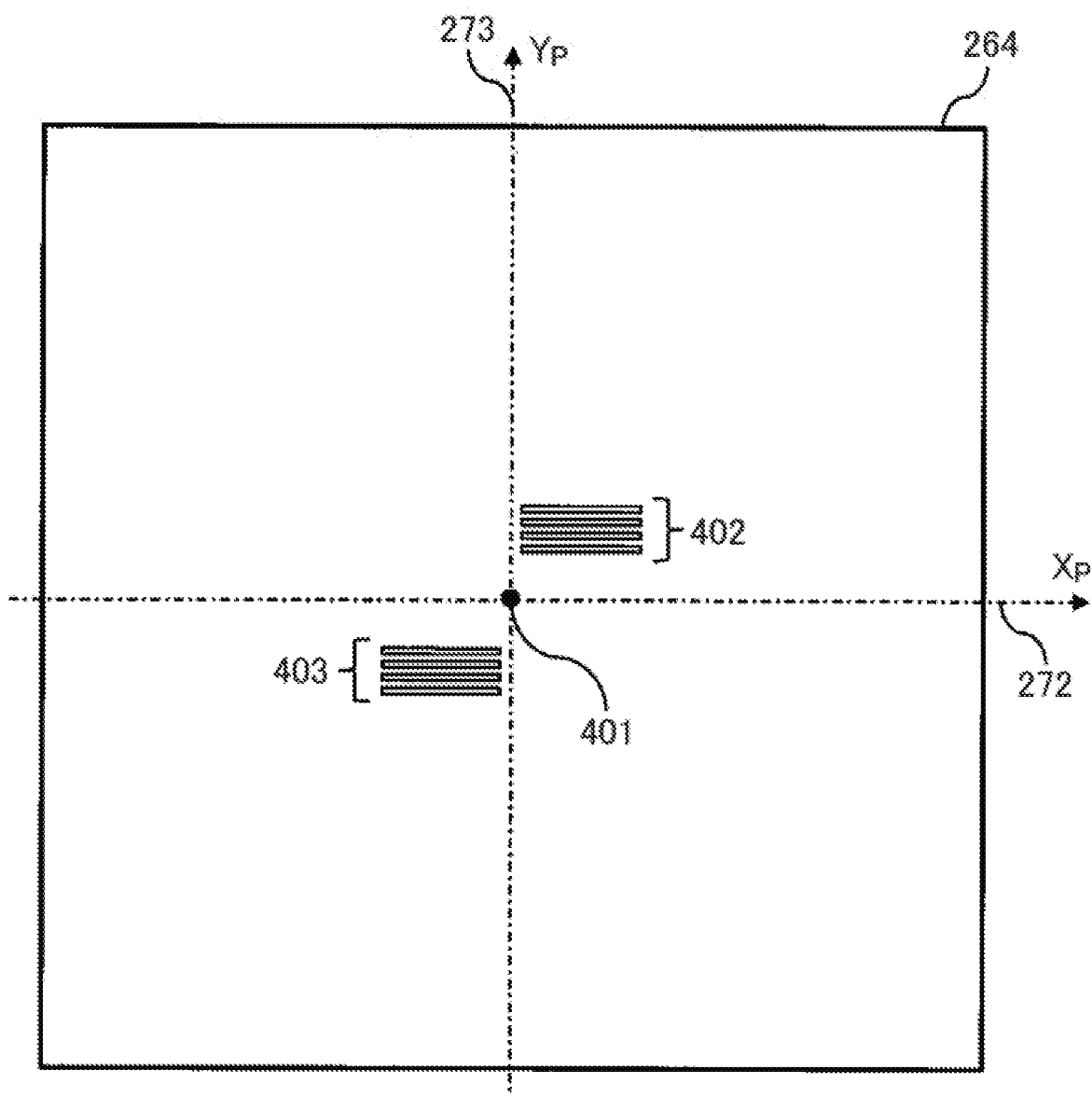
FIG. 4 is a plan view of a two-dimensional slit of the embodiment of the present invention.

FIG. 4 is a plan view of the two-dimensional slit 264 viewed from the measurement object 115 side. The two-dimensional slit 264 includes a first slit group 402 on one side and a second slit group 403 on the other side across the $X_p$ axis 272 and the $Y_p$ axis 273 passing through an optical axis 401 of the projection optical system 251. In this embodiment, the first slit group 402 and the second slit group 403 each include four slits. As illustrated in FIG. 4, in each of the first slit group 402 and the second slit group 403, the slits are each arranged in a short side direction of the included slits. The slits of the first slit group 402 and the second slit group 403 each have a longer side direction approximately parallel to the $X_p$ axis 272. The first slit group 402 and the second slit group 403 are configured to each include at least one slit, and the number of the slits can be increased corresponding to the required accuracy in the control of the stage height.

Figure 5:
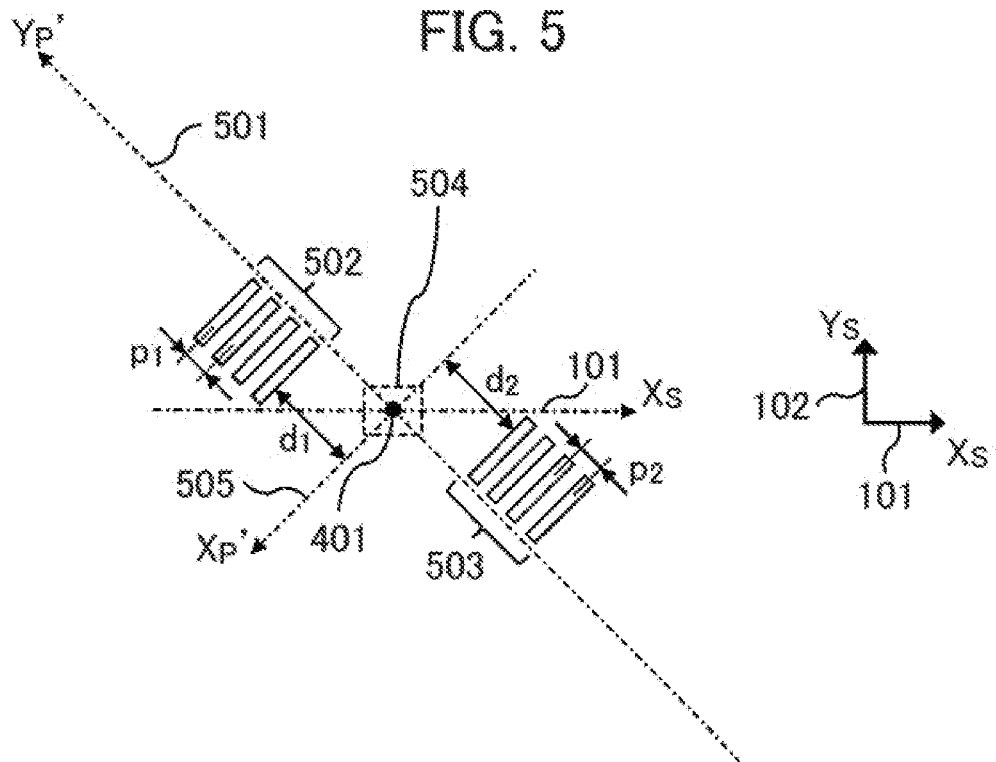
FIG. 5 is a drawing illustrating an image of the two-dimensional slit projected on a surface of a measurement object.

FIG. 5 is a drawing illustrating an image of the two-dimensional slit 264 projected on the surface of the measurement object 115. The $Y_p'$ axis 501 of FIG. 5 corresponds to the projection of the $Y_p$ axis 273 of FIG. 4 on the surface of the measurement object 115. The $Y_p'$ axis 501 corresponds to the projection of the optical axis 401 on the surface of the measurement object 115. The $X_p'$ axis 505 corresponds to the projection of the $X_p$ axis 272 in the optical axis 401 direction on the surface of the measurement object 115. Since the $X_p$ axis 272 and the $X_p'$ axis 505 are in a relation of an inverted image, they are illustrated in mutually inverted directions. As illustrated in FIG. 5, the projection optical system 251 projects a first pattern 502 as an image of the first slit group 402 on one side and a second pattern 503 as an image of the second slit group 403 on the other side across the optical axis 401, the $X_p'$ axis 505, and the $Y_p'$ axis 501 of the projection optical system 251. Thus, the first pattern 502 is projected closer to the projection optical system 251 compared with the second pattern 503. Additionally, the first pattern 502 is projected on one side and the second pattern 503 is projected on the other side across the $Y_p'$ axis 501 as the projection of the optical axis 401 of the projection optical system 251 on the surface of the measurement object 115. The first pattern 502 and the second pattern 503 are the projections of the first slit group 402 and the second slit group 403 enlarged by the projection lens 266. Further, because of the projection with the incident angle of θ from the projection optical system 251 as illustrated in FIG. 3, the first slit group 402 and the second slit group 403 are projected on the surface of the measurement object 115 while being enlarged 1/sin (90°−θ) times in the $Y_p'$ axis 501 direction. A distance $d_1$ between the first pattern 502 and the $X_p$ axis 272, and a distance $d_2$ between the second pattern 503 and the $X_p$ axis 273 can be each set to, for example, 1 mm. An interval, which is a pitch of each of the first pattern 502 and the second pattern 503, of the slits in the short side direction included in each of the first pattern 502 and the second pattern 503 is smaller than $d_1+d_2$ as a distance between the first pattern 502 and the second pattern 503. FIG. 5 illustrates a pitch $p_1$ of the first pattern 502 and a pitch $p_2$ of the second pattern 503.

An area where the scanning electron microscope system of the CD-SEM device 100 scans the electron beam as the charged particle beam is, for example, an area 504 enclosed by a dashed line in FIG. 5. Here, the area where the scanning electron microscope system scans the electron beam as the charged particle beam has a size that changes corresponding to a size of an area desired to obtain the image. At least a part of the area where the scanning electron microscope system scans the electron beam is positioned between the first pattern 502 and the second pattern 503. This ensures the measurement of the line width and the hole diameter in the fine pattern of a semiconductor wafer and the like as the measurement object 115 to the nearby edge of the measurement object 115 with high throughput and high accuracy by measuring the height of the surface of the measurement object 115 described later.

Figure 6:
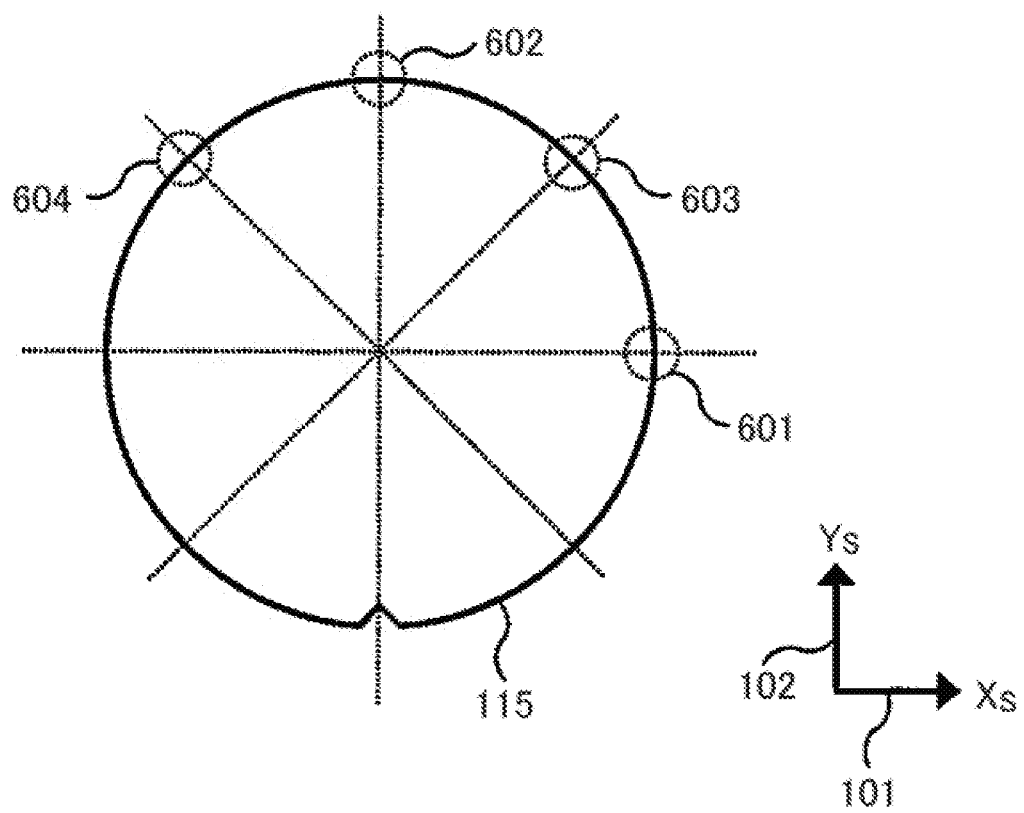
FIG. 6 is a drawing illustrating an exemplary edge part of a semiconductor wafer as the measurement object.
Figure 7A:
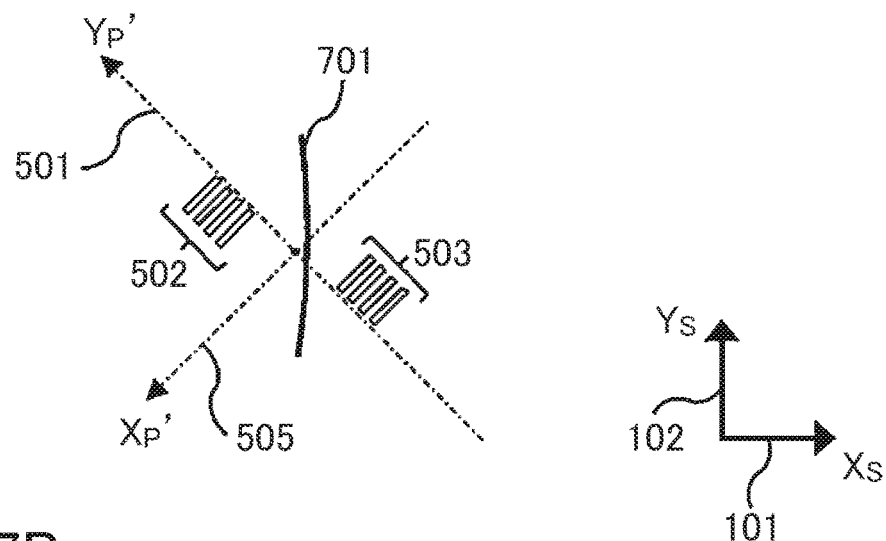
FIG. 7A is a drawing illustrating projected states of a first slit group and a second slit group near the edge of the semiconductor wafer as the measurement object.
Figure 7B:
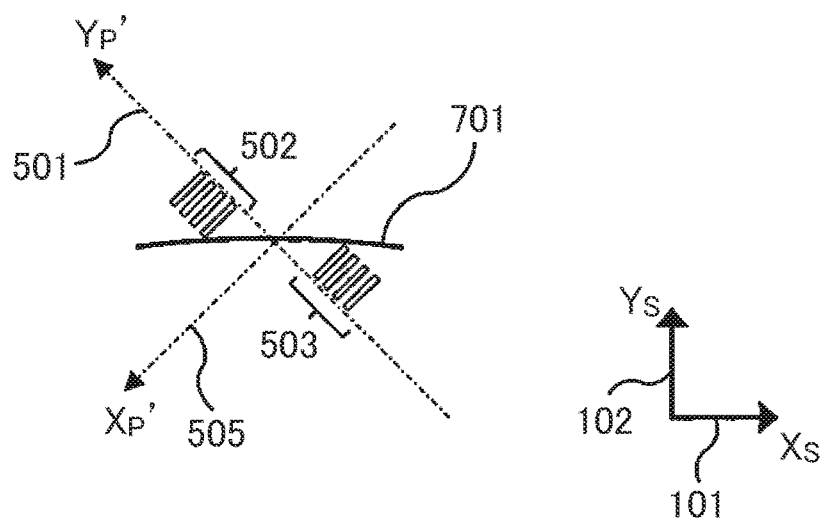
FIG. 7B is a drawing illustrating the projected states of the first slit group and the second slit group near the edge of the semiconductor wafer as the measurement object.
Figure 7C:
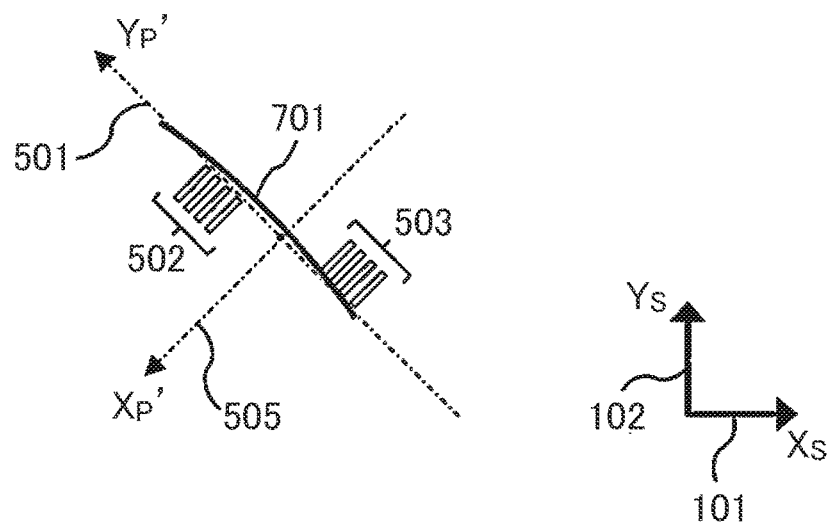
FIG. 7C is a drawing illustrating the projected states of the first slit group and the second slit group near the edge of the semiconductor wafer as the measurement object.
Figure 7D:
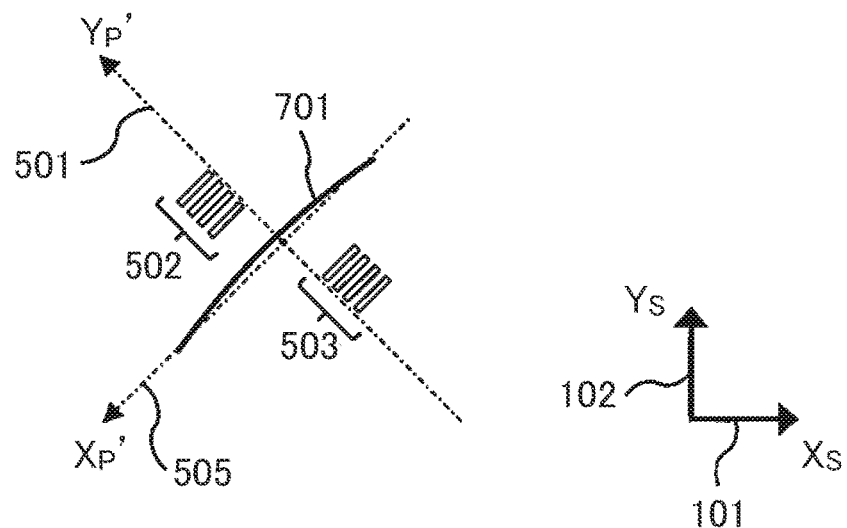
FIG. 7D is a drawing illustrating the projected states of the first slit group and the second slit group near the edge of the semiconductor wafer as the measurement object.

With reference to FIG. 6 and FIGS. 7(a) to 7(d), a description will be given of the projection states of the first slit group 402 and the second slit group 403 near the edge of the semiconductor wafer when the measurement object 115 is the semiconductor wafer. FIG. 7(a) illustrates the projection state at an $X_s$ near-edge area 601 of FIG. 6, FIG. 7(b) illustrates the projection state at a $Y_s$ near-edge area 602 of FIG. 6, FIG. 7(c) illustrates the projection state at a 45° near-edge area 603 of FIG. 6, and FIG. 7(d) illustrates the projection state at a −45° near-edge area 604 of FIG. 6.

As illustrated in FIG. 7(a), at the $X_s$ near-edge area 601, the first pattern 502 is projected inside a wafer edge 701 on the measurement object 115. Meanwhile, at the $X_s$ near-edge area 601, the second pattern 503 is not projected on the measurement object 115. Accordingly, at the $X_s$ near-edge area 601, the measurement of the position of the first pattern 502 ensures the measurement of the height of the measurement object 115.

As illustrated in FIG. 7(b), at the $Y_s$ near-edge area 602, the second pattern 503 is projected inside the wafer edge 701 on the measurement object 115. Meanwhile, at the $Y_s$ near-edge area 602, the first pattern 502 is not projected on the measurement object 115. Accordingly, at the $Y_s$ near-edge area 602, the measurement of the position of the second pattern 503 ensures the measurement of the height of the measurement object 115.

As illustrated in FIG. 7(c), at the 45° near-edge area 603, the first pattern 502 is projected inside the wafer edge 701 on the measurement object 115. Meanwhile, at the 45° near-edge area 603, the second pattern 503 is not projected on the measurement object 115. Accordingly, at the 45° near-edge area 603, the measurement of the position of the first pattern 502 ensures the measurement of the height of the measurement object 115.

As illustrated in FIG. 7(d), at the −45° near-edge area 604, the second pattern 503 is projected inside the wafer edge 701 on the measurement object 115. Meanwhile, at the −45° near-edge area 604, the first pattern 502 is not projected on the measurement object 115. Accordingly, at the −45° near-edge area 604, the measurement of the position of the second pattern 503 ensures the measurement of the height of the measurement object 115.

As described above, in this embodiment, the height of the measurement object 115 can be measured from at least any of the first pattern 502 and the second pattern 503. Since at least any of the first pattern 502 and the second pattern 503 can hold the number of the slits included in the image, the time necessary for identifying and complementing the undetectable slit can be saved.

Figure 8:
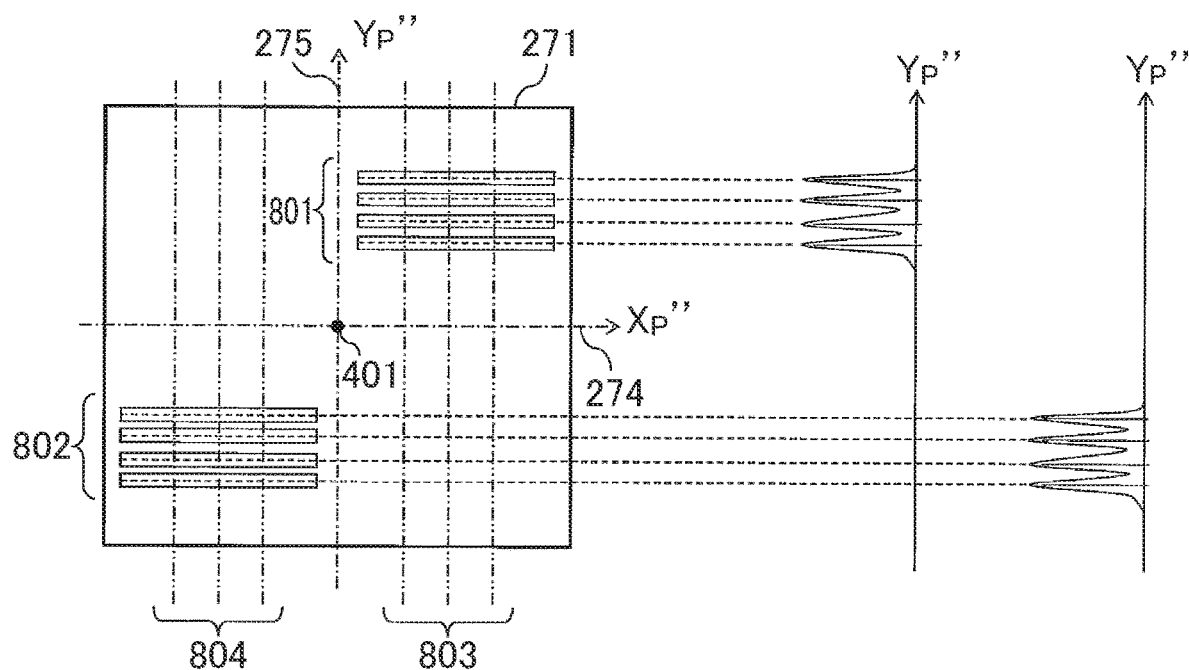
FIG. 8 is a drawing illustrating a first pattern and a second pattern projected on a two-dimensional area sensor.

FIG. 8 illustrates a first pattern 801 and a second pattern 802 projected on the two-dimensional area sensor 271 viewed from the magnifying lens 270 side. The first pattern 801 corresponds to a projection pattern of the first slit group 402, and the second pattern 802 corresponds to a projection pattern of the second slit group 403. As illustrated in FIG. 8, by the projection optical system 251 and the detection optical system 252, the first pattern 801 as the image of the first slit group 402 is projected on one side and the second pattern 802 as the image of the second slit group 403 is projected on the other side across the optical axis 401 and the $Y_p''$ axis 275 of the projection optical system 251.

The electrical signal detector 131 detects the electrical signal from the two-dimensional area sensor 271 caused by at least any of the first pattern 801 and the second pattern 802. The electrical signal detector 131 can obtain the electrical signal caused by the first pattern 801 on lines corresponding to a plurality of lines 803 along the $Y_p''$ axis 275 direction illustrated in FIG. 8. Similarly, the electrical signal detector 131 can obtain the electrical signal caused by the second pattern 802 on lines corresponding to a plurality of lines 804 along the $Y_p''$ axis 275 direction illustrated in FIG. 8. Thus, the first pattern 801 as the image of the first slit group 402 is projected on one side and the second pattern 802 as the image of the second slit group 403 is projected on the other side across the $Y_p''$ axis 275 passing through the optical axis 401 of the projection optical system 251. This ensures obtaining the electrical signal caused by the first pattern 801 on the plurality of lines 803 along the $Y_p''$ axis 275 direction without the influence of the second pattern 802. Additionally, on the plurality of lines 804 along the $Y_p''$ axis 275 direction, the electrical signal caused by the second pattern 802 can be obtained without the influence of the first pattern 801. Accordingly, at least any of on the plurality of lines 803 along the $Y_p''$ axis 275 and on the plurality of lines 804 along the $Y_p''$ axis 275, the signal where the number of the slits does not lack can be obtained. When the number of the slits does not lack, the electrical signal having peaks corresponding to respective slits as illustrated on the right side of FIG. 8 can be obtained on each line of the plurality of lines 803 and the plurality of lines 804.

The height calculation processor 132 chooses the image of at least one of the first pattern 801 and the second pattern 802, and calculates the height of the measurement object 115. Specifically, on the plurality of lines 803 along the $Y_p''$ axis 275 direction or on the plurality of lines 804 along the $Y_p''$ axis 275 direction, the height calculation processor 132 chooses the one where the signal without the lack of the number of the slit images is obtained, and calculates the height of the measurement object 115 from the change of the peak position corresponding to the slit position in the chosen signal. Conversely, on the plurality of lines 803 along the $Y_p''$ axis 275 direction or on the plurality of lines 804 along the $Y_p''$ axis 275 direction, the height calculation processor 132 ignores the one where the signal with the lack of the number of the slit images is obtained, and calculates the height of the measurement object 115 from the change of the peak position corresponding to the slit position in the remaining signal. Whether the number of the slit images lacks or not can be determined such that, for example, when the number of the peaks with strength exceeding a predetermined threshold is only less than four on at least any one line among the plurality of lines 803 along the $Y_p''$ axis 275 direction and the plurality of lines 804 along the $Y_p''$ axis 275 direction, the number of the slit images is determined to be lacked. This ensures the height calculation processor 132 to choose the pattern where every slit image in the slit group is obtained in the first pattern 801 and the second pattern 802. While the plurality of lines 803 along the $Y_p''$ axis 275 direction and the plurality of lines 804 along the $Y_p''$ axis 275 direction each include three lines in this embodiment, the number of lines can be chosen corresponding to the required accuracy in the height measurement.

In addition to the method to determine whether the number of the slit images lacks or not as described above, the pattern where every slit image in the slit group is obtained can be chosen also such that information on choosing the first pattern 801 or the second pattern 802 associated with a movement destination of the XY-stage 116 is preliminarily stored in the storage 143, and the height calculation processor 132 refers to this information and chooses the first pattern 801 or the second pattern 802 in accordance with the move of the XY-stage 116.

The method for choosing the first pattern 801 or the second pattern 802 can be achieved, in addition to the above-described method, such that the height calculation processor 132 chooses the first pattern 801 when an integral of the signals with the strength from the right side area of the $Y_p''$ axis 275 of the two-dimensional area sensor 271 illustrated in FIG. 8 becomes less than a predetermined threshold, and chooses the second pattern 802 when an integral of the signals with the strength from the left side area of the $Y_p''$ axis 275 becomes less than a predetermined threshold. Thus, the first pattern 502 is projected on one side and the second pattern 503 is projected on the other side across the $Y_p'$ axis 501 as the projection of the optical axis 401 of the projection optical system 251 on the surface of the measurement object 115. This ensures easily choosing the pattern where the signal without the lack of the number of the slit images is obtained with a simple area setting such as the integral of the signals with the strength in the right half area and the integral of the signals with the strength in the left half area of the two-dimensional area sensor 271, without identifying which slit image in the first pattern 801 or the second pattern 802 is lacked.

In this embodiment, in each of the first pattern 801 and the second pattern 802, four slit images are obtained in the case without the lack, and on the three lines of the plurality of lines 803 along the $Y_r$" axis 275 direction and on the three lines of the plurality of lines 804 along the $Y_r$" axis 275 direction, the respective peak positions are measurable. This ensures the calculation of $\Delta Z_s$ as the change amount of the height of the measurement object 115 from an average of the peak positions of at least 12 positions. Accordingly, the height detection can be performed near the edge of the measurement object 115 with high accuracy at high speed. When every slit image is obtained in both the first pattern 801 and the second pattern 802, both the above-described 12 peaks in the first pattern 801 and the above-described 12 peaks in the second pattern 802 can be used to calculate $\Delta Z_s$ with higher accuracy from the average of the peak positions of 24 positions in total. While the change in the peak positions of the four slit images are measured to calculate $\Delta Z_s$ as the change amount of the height in this embodiment, a trough position between the peaks of the slit images also can be measured to calculate $\Delta Z_s$.

As described above, this embodiment can provide the technique to detect the height near the edge of the measurement object with high accuracy at high speed. Eventually, dies can be obtained to the nearby the wafer edge.

Second Embodiment

Figure 9:
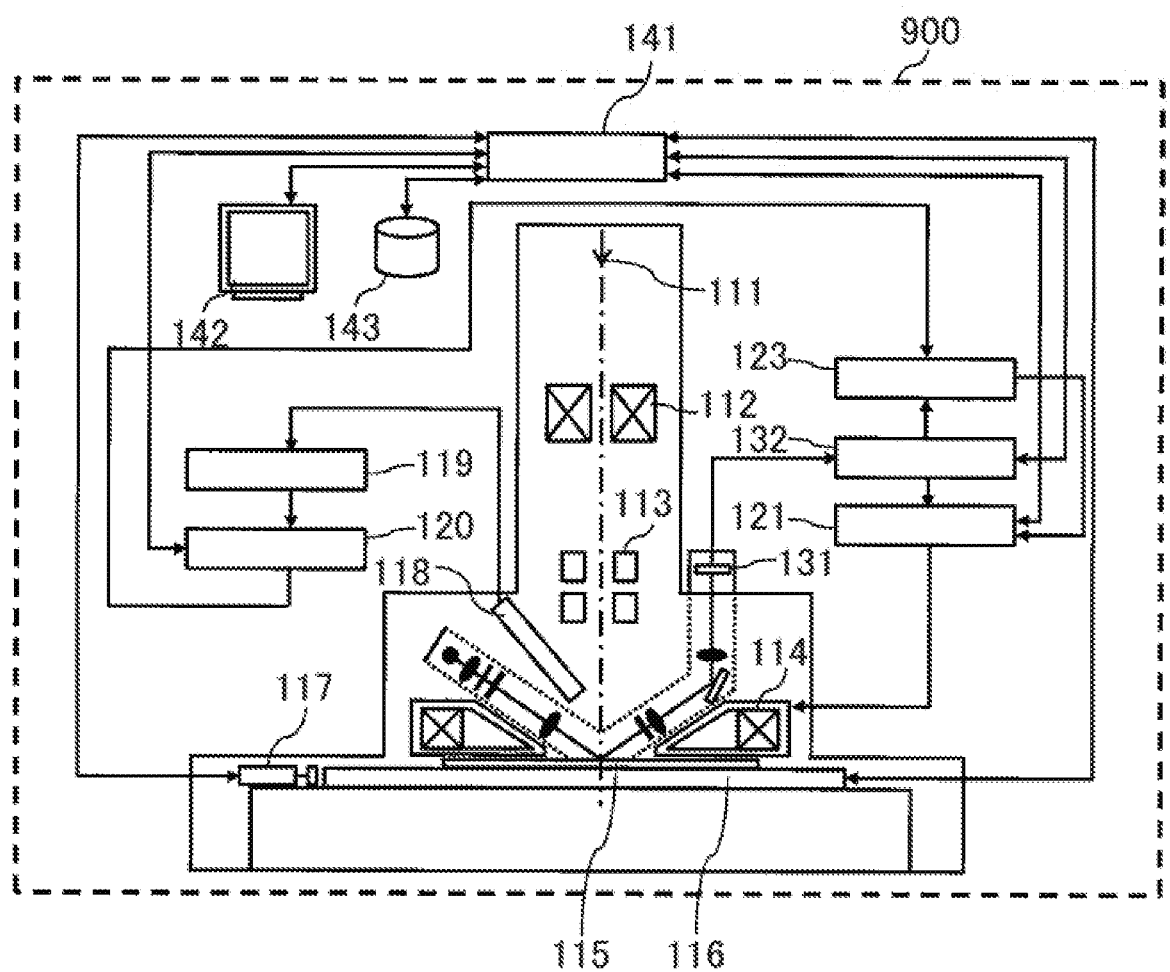
FIG. 9 is a schematic diagram illustrating a device configuration of a CD-SEM device in a second embodiment of the present invention.

FIG. 9 is a schematic diagram illustrating a device configuration of a CD-SEM device 900 in the second embodiment of the present invention.

The CD-SEM device 900 of this embodiment is different from the above-described CD-SEM device 100 of the first embodiment in that, in the focal point control system, the CD-SEM device 100 focuses the objective lens 114 by adjusting the height of the measurement object 115 on the Z-stage 122 based on the information on the height of the measurement object 115 output from the height calculation processor 132, while the CD-SEM device 900 focuses the objective lens 114 with the focal point controller 121 configured to adjust an exciting current of the objective lens 114. Since the CD-SEM device 900 of this embodiment does not adjust the height of the measurement object 115 on the Z-stage 122 like the CD-SEM device 100 of the first embodiment, the change in the height of the measurement object 115 during operation becomes larger than that of the CD-SEM device 100. Accordingly, the CD-SEM device 900 is preferred to have $d_1$ and $d_2$ in FIG. 5 larger than those of the CD-SEM device 100 in consideration of the changes in the positions of the first pattern 801 and the second pattern 802 due to the change in the height of the measurement object 115 during the operation of the CD-SEM device 900.

The CD-SEM device 900 of this embodiment can provide the technique to detect the height to the nearby edge of the measurement object with high accuracy at high speed from the first pattern 801 and the second pattern 802, similarly to the CD-SEM device 100. Eventually, the dies can be obtained to the nearby wafer edge.

Third Embodiment

Figure 10:
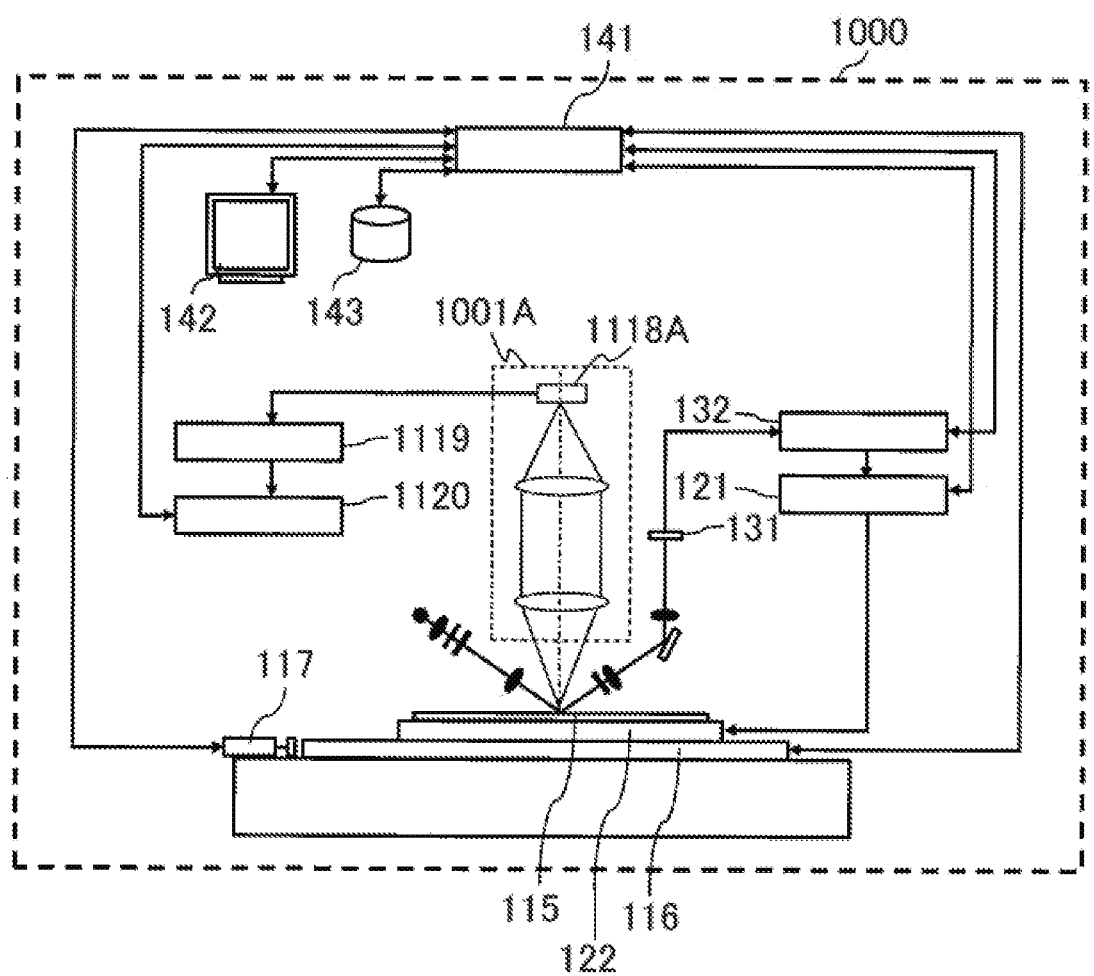
FIG. 10 is a schematic diagram illustrating a device configuration of an optical inspection device in a third embodiment of the present invention.

FIG. 10 is a schematic diagram illustrating a device configuration of an optical inspection device 1000 in the third embodiment of the present invention.

The optical inspection device 1000 of this embodiment is different from the above-described CD-SEM device 100 of the first embodiment in that, the CD-SEM device 100 emits the electron beam to detect the secondary electron emitted from the measurement object 115, while the optical inspection device 1000 emits a laser light to detect a scattered light emitted from the measurement object 115. The optical inspection device 1000 of this embodiment can provide the technique to detect the height to the nearby edge of the measurement object with high accuracy at high speed from the first pattern 801 and the second pattern 802, similarly to the CD-SEM device 100. Eventually, the dies can be obtained to the nearby wafer edge.

Figure 11:
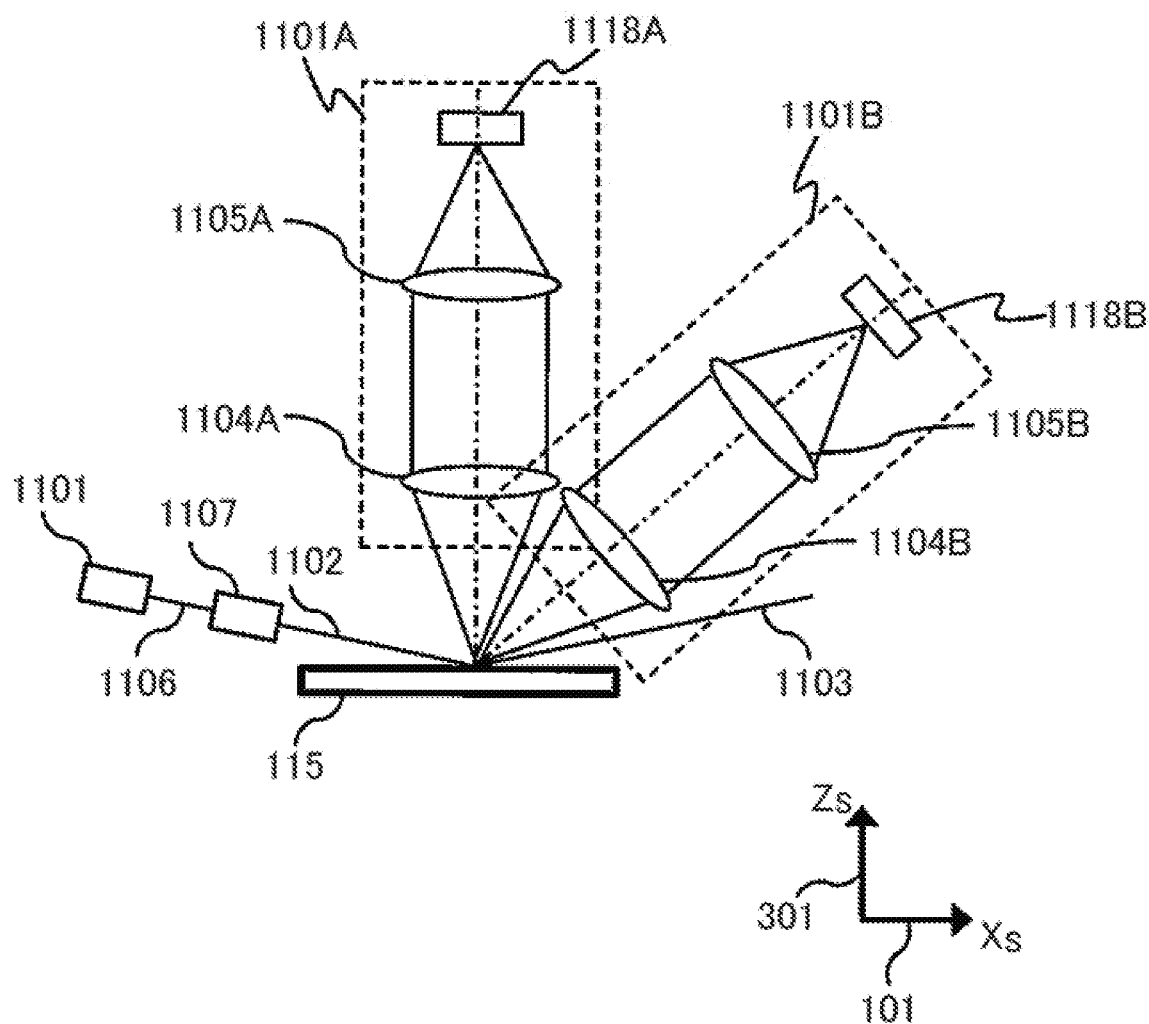
FIG. 11 is a schematic diagram illustrating an optical system for an inspection in the optical inspection device in the third embodiment of the present invention.

The following mainly describes the difference from the CD-SEM 100 of the first embodiment. FIG. 11 is a schematic diagram illustrating an optical system for an inspection in the optical inspection device 1000.

The optical inspection device 1000 includes a laser light source 1101, a beam forming unit 1107, and scattered light detection systems 1001A and 1001B. The beam forming unit 1107 foams a laser light 1106 from the laser light source 1101 in a thin wire shape. The scattered light detection systems 1001A and 1001B emit a laser light 1102 famed in the thin wire shape to detect a scattered light caused by a foreign object and a defect on the surface of the measurement object 115. FIG. 10 omits the scattered light detection system 1001B. A reflected light 1103 generated by emitting the laser light 1102 and regularly reflected by the surface of the measurement object 115 does not enter either the scattered light detection system 1001A or the scattered light detection system 1001B. That is, the optical inspection device 1000 has a dark-field illumination. The measurement object 115 is, for example, a semiconductor wafer on which a fine pattern is foamed. The optical inspection device 1000 can additionally include a rotary stage to correct an angle deviation of the measurement object 115, in addition to the XY-stage 116 and the Z-stage 122.

The scattered light detection system 1001A includes an objective lens 1104A, an imaging lens 1105A, and a one-dimensional sensor array 1118A. The scattered light detection system 1001B includes an objective lens 1104B, an imaging lens 1105B, and a one-dimensional sensor array 1118B. While the scattered light detection system 1001A has an optical axis approximately perpendicular to the surface of the measurement object 115, the scattered light detection system 1001B has an optical axis inclined with respect to the $Z_s$ direction 301 as a direction perpendicular to the surface of the measurement object 115. Accordingly, the scattered light detection system 1001A and the scattered light detection system 1001B detect the scattered light in the directions different from one another. The laser light source 1101, the scattered light detection system 1001A, and the scattered light detection system 1001B are arranged to be aligned in the $X_s$ direction 101. Optical paths of the laser light 1102 and the reflected light 1103 are projected to the measurement object 115 along the $X_s$ direction 101. The objective lens 1104A of the scattered light detection system 1001A and the objective lens 1104B of the scattered light detection system 1001B are disposed so as not to interfere with the visual field of the projection optical system 251. The scattered light detection system 1001A detects the scattered light photoelectrically converted by the one-dimensional sensor array 1118A. The scattered light detection system 1001B detects the scattered light photoelectrically converted by the one-dimensional sensor array 1118B.

The optical inspection device 1000 includes an A/D converter 1119 and image processing means 1120. The A/D converter 1119 digitizes an output of the one-dimensional sensor array 1118A and an output of the one-dimensional sensor array 1118B. The image processing means 1120 extracts information on the defect and the foreign object on the measurement object 115 based on information on strength of the digitized scattered light.

In the focal point control system of this embodiment, the focal point controller 121 adjusts the height of the measurement object 115 on the Z-stage 122 based on information on the height of the measurement object 115 output from the height calculation processor 132, thus focusing the scattered light detection system 1001A and the scattered light detection system 1001B on the measurement object 115.

Figure 12:
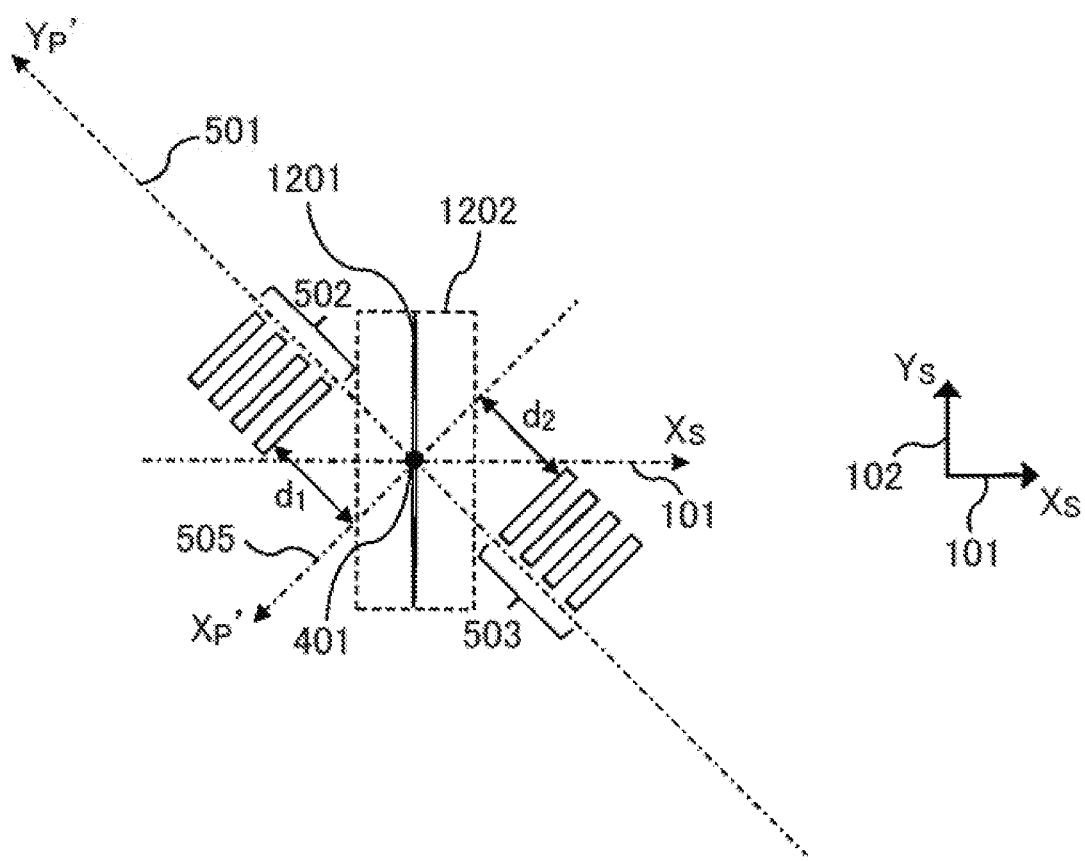
FIG. 12 is a drawing illustrating an image of a two-dimensional slit projected on a surface of a measurement object.

FIG. 12 illustrates an image of a two-dimensional slit projected on the surface of the measurement object 115. A difference from the case of the CD-SEM device 100 illustrated in FIG. 5 is that instead of the area 504 as the area where the scanning electron microscope system of the CD-SEM device 100 scans the electron beam as the charged particle beam, in FIG. 12, an irradiation area 1201 of the laser light 1102 formed in the thin wire shape and a field of view 1202 are present between the first pattern 502 and the second pattern 503. Accordingly, the projection optical system 251 projects the first pattern 502 on one side and the second pattern 503 on the other side across the field of view 1202 on the measurement object 115. The field of view 1202 corresponds to the field of view of the scattered light detection system 1001A and the scattered light detection system 1001B. Therefore, the scattered light from the foreign object and the defect present in the irradiation area 1201 is measured by the scattered light detection system 1001A or the scattered light detection system 1001B depending on the direction of the scattered light.

In the optical inspection device 1000, the field of view 1202 does not overlap any of the first pattern 502 and the second pattern 503. This ensures the restriction of the light from the projection optical system 251 from entering the scattered light detection system 1001A and the scattered light detection system 1001B, thus providing the inspection of the surface of the measurement object 115 with high accuracy. Similarly to the CD-SEM device 100 of the first embodiment, also in the optical inspection device 1000, the projection optical system 251 and the detection optical system 252 can be disposed to be inclined with respect to the $X_s$ direction 101 by 45°. In the optical inspection device 1000, the distance $d_1$ between the first pattern 502 and the $X_p$ axis 272, and the distance $d_2$ between the second pattern 503 and the $X_p$ axis 273 can be each set to, for example, 1.5 mm.

Similarly to the CD-SEM device 100 of the first embodiment, the optical inspection device 1000 can use at least any image of the first pattern 502 and the second pattern 503 to adjust the height of the Z-stage 122. Furthermore, the optical inspection device 1000 of this embodiment can use at least any image of the first pattern 502 and the second pattern 503 to reduce the change in the height of the measurement object 115 caused in the move of the XY-stage 116. Especially, the change in the height of the measurement object 115 can be accurately reduced when the irradiation area 1201 and the field of view 1202 are scanned on the measurement object 115 by moving the XY-stage 116 in the $X_s$ direction 101, thus ensuring the inspection of the measurement object 115 to the nearby edge of the measurement object 115 such as a wafer with high accuracy at high speed. Eventually, the dies can be obtained near the edge of the measurement object 115 such as a wafer.

Since the first pattern 502 and the second pattern 503 are arranged at symmetrical positions with respect to the optical axis 401, the visual field of the projection optical system 251 can be effectively used. Even in the arrangement where the objective lens 1104A and the objective lens 1104B do not interfere with the visual field of the projection optical system 251, the height measurement is ensured with high accuracy.

In addition to the method to determine whether the number of the slit images lacks or not as described above, in this embodiment, the pattern where every slit image in the slit group is obtained can be chosen also such that information on choosing the first pattern 801 or the second pattern 802 associated with the position of the irradiation area 1201 or the field of view 1202 on the measurement object 115 is preliminarily stored in the storage 143, and the height calculation processor 132 refers to this information and chooses the first pattern 801 or the second pattern 802 in accordance with the move of the XY-stage 116.

While the embodiments of the present invention have been specifically described above, the present invention is not limited to the above-described embodiments, and various changes can be made without departing from the scope of the present invention.

LIST OF REFERENCE SIGNS

100 CD-SEM device
115 measurement object
251 projection optical system
402 first slit group
403 second slit group
502 first pattern
503 second pattern

The invention claimed is:

1. A charged particle beam device comprising:
a stage;
a projection optical system that projects a first pattern on one side and a second pattern on another side across at least a part of a scanning area of a charged particle beam on a wafer placed on the stage, the first pattern and the second pattern being projected from an oblique direction with respect to a surface of the wafer; and
an imaging device that obtains images of the first pattern and the second pattern,
wherein at least one of the images of the first pattern and the second pattern is chosen to measure a height of the wafer,
wherein the projection optical system further comprises a plurality of first slits that projects the first pattern via a first slit group, and a plurality of second slits that projects the second pattern via a second slit group, and
the plurality of first slits are disposed at a first side with respect to an optical axis of the projection optical system, and the plurality of the second slits are disposed at a second side with respect to the optical axis of the projection optical system.

2. The charged particle beam device according to claim 1, wherein
when the image of the first pattern lacks in the vicinity of the edge of x axis or y axis of the stage, the second pattern is chosen to measure the height of the wafer.

3. The charged particle beam device according to claim 1, wherein the plurality of the first slits and the plurality of the second slits are arranged in a short side direction of the first and second slit groups, respectively.

4. A charged particle beam device comprising:

a stage movable in at least a height direction;

a projection optical system that projects a first pattern on one side and a second pattern on another side across at least a part of a scanning area of a charged particle beam on a wafer placed on the stage, the first pattern and the second pattern being projected from an oblique direction with respect to a surface of the wafer; and a detection optical system that detects a light emitted from the projection optical system and reflected by the surface of the wafer, wherein, on the wafer, the second pattern is projected to an area on the wafer closer to the projection optical system compared with the first pattern, and the first pattern is projected on one side and the second pattern is projected on another side across a projection of an optical axis of the projection optical system on the surface of the wafer, wherein the projection optical system further comprises a plurality of first slits that projects the first pattern via a first slit group, and a plurality of second slits that projects the second pattern via a second slit group, and the plurality of first slits are disposed at a first side with respect to the optical axis of the projection optical system, and the plurality of the second slits are disposed at a second side with respect to the optical axis of the projection optical system.

5. The charged particle beam device according to claim 4, wherein the first pattern and the second pattern each have a pitch smaller than a distance between the first pattern and the second pattern.

6. The charged particle beam device according to claim 4, wherein the stage has a height adjusted based on at least one of the first pattern and the second pattern.

7. The charged particle beam device according to claim 6, wherein the height of the stage is adjusted based on at least one of the first pattern and the second pattern in accordance with a lack of an image of the first pattern or the second pattern.

8. An optical inspection device comprising:

a stage movable in at least a height direction;

a projection optical system that projects a first pattern on one side and a second pattern on another side across a field of view on a wafer placed on the stage, the first pattern and the second pattern being projected from an oblique direction with respect to a surface of the wafer; and an imaging device that obtains images of the first pattern and the second pattern, wherein at least one of the images of the first pattern and the second pattern is chosen to adjust a height the stage, wherein the projection optical system further comprises a plurality of first slits that projects the first pattern via a first slit group, and a plurality of second slits that projects the second pattern via a second slit group, and the plurality of first slits are disposed at a first side with respect to an optical axis of the projection optical system, and the plurality of the second slits are disposed at a second side with respect to the optical axis of the projection optical system.

9. The optical inspection device according to claim 8, wherein at least one of the images of the first pattern and the second pattern is chosen to adjust the height of the stage in accordance with a position of the field of view.

10. The optical inspection device according to claim 8, wherein at least one of the images of the first pattern and the second pattern is chosen to adjust the height of the stage in accordance with a lack of the image of the first pattern or the second pattern.

11. The optical inspection device according to claim 8, wherein, on the wafer, the first pattern is projected to an area on the wafer closer to the projection optical system compared with the second pattern.

12. The optical inspection device according to claim 8, wherein the height of the stage is adjusted based on a change in positions of a plurality of strength peaks included in the chosen image.

13. The optical inspection device according to claim 9, wherein the first pattern is projected on one side and the second pattern is projected on another side across a projection of an optical axis of the projection optical system on the surface of the wafer.

14. The optical inspection device according to claim 12, further comprising:

a first detection optical system that detects a scattered light in a first direction; and a second detection optical system that detects the scattered light in a second direction.

* * * * *